(12) United States Patent
Yang et al.

(10) Patent No.: US 10,191,841 B2
(45) Date of Patent: Jan. 29, 2019

(54) HOST DEVICE, ACCESS SYSTEM, AND ACCESS METHOD

(71) Applicant: Shannon Systems Ltd., Shanghai (CN)

(72) Inventors: Xueshi Yang, Cupertino, CA (US); Ningzhong Miao, Shanghai (CN)

(73) Assignee: SHANNON SYSTEMS LTD., Shanghai (CN)

( * ) Notice: Subject to any disclaimer, the term of this patent is extended or adjusted under 35 U.S.C. 154(b) by 0 days.

(21) Appl. No.: 15/202,091

(22) Filed: Jul. 5, 2016

(65) Prior Publication Data

US 2017/0010962 A1 Jan. 12, 2017

Related U.S. Application Data

(60) Provisional application No. 62/188,894, filed on Jul. 6, 2015.

(30) Foreign Application Priority Data

Jun. 24, 2016 (CN) .......................... 2016 1 0472229

(51) Int. Cl.
*G06F 12/02* (2006.01)
*G06F 3/06* (2006.01)
(Continued)

(52) U.S. Cl.
CPC .......... *G06F 12/0246* (2013.01); *G06F 3/064* (2013.01); *G06F 3/0608* (2013.01);
(Continued)

(58) Field of Classification Search
CPC .. G06F 12/0246; G06F 3/0608; G06F 3/0626; G06F 3/064; G06F 3/0665;
(Continued)

(56) References Cited

U.S. PATENT DOCUMENTS 5,579,474 A * 11/1996 Kakuta ............... G06F 11/1076
714/6.21
5,754,756 A * 5/1998 Watanabe ........... G06F 11/1076
711/114
(Continued)

FOREIGN PATENT DOCUMENTS

CN 102915212 A 2/2013
CN 103019882 A 4/2013
(Continued)

OTHER PUBLICATIONS

Chinese language office action dated Oct. 31, 2017, issued in application No. TW 105121071.

*Primary Examiner* — Ramon A. Mercado
(74) *Attorney, Agent, or Firm* — McClure, Qualey & Rodack, LLP

(57) ABSTRACT

A host device is provided. The host device includes a processor and an interface. The processor generates a physical block address and a solid state disk (SSD) identification code according to a logical block address of an access operation. The interface is coupled to the processor. The processor indicates one of a plurality of SSDs through the interface according to the SSD identification code to access data at the physical block address.

24 Claims, 3 Drawing Sheets

US 10,191,841 B2
Page 2

(51) Int. Cl.
*G11C 29/52* (2006.01)
*G11C 16/20* (2006.01)
*G06F 11/10* (2006.01)
*G11C 29/04* (2006.01)

(52) U.S. Cl.
CPC .......... *G06F 3/0626* (2013.01); *G06F 3/0665* (2013.01); *G06F 3/0688* (2013.01); *G06F 11/108* (2013.01); *G06F 11/1012* (2013.01); *G11C 16/20* (2013.01); *G11C 29/52* (2013.01); *G06F 2212/1044* (2013.01); *G06F 2212/1056* (2013.01); *G06F 2212/152* (2013.01); *G06F 2212/214* (2013.01); *G06F 2212/262* (2013.01); *G06F 2212/403* (2013.01); *G06F 2212/7201* (2013.01); *G06F 2212/7208* (2013.01); *G11C 2029/0411* (2013.01)

(58) Field of Classification Search
CPC ............... G06F 3/0688; G06F 11/1068; G06F 2212/1044; G06F 2212/1056; G06F 2212/152; G06F 2212/214; G06F 2212/262; G06F 2212/403; G06F 2212/7201; G06F 2212/7208; G11C 16/20; G11C 29/52; G11C 2029/0411
See application file for complete search history.

(56) References Cited

U.S. PATENT DOCUMENTS

| | | | | |
|---|---|---|---|---|
| 8,316,260 | B1* | 11/2012 | Bonwick | G06F 11/1076 711/114 |
| 8,595,606 | B1 | 11/2013 | Feng et al. | |
| 8,892,938 | B1 | 11/2014 | Sundaram et al. | |
| 8,954,657 | B1* | 2/2015 | Asnaashari | G06F 12/0246 711/103 |
| 9,164,887 | B2 | 10/2015 | Chiueh et al. | |
| 9,251,059 | B2* | 2/2016 | Nemazie | G06F 12/0246 |
| 2003/0009619 | A1* | 1/2003 | Kano | G06F 3/0605 711/112 |
| 2005/0114729 | A1 | 5/2005 | Nielsen et al. | |
| 2008/0104431 | A1* | 5/2008 | Shimada | G06F 1/3221 713/300 |
| 2009/0240873 | A1 | 9/2009 | Yu et al. | |
| 2010/0017650 | A1 | 1/2010 | Chin et al. | |
| 2010/0115183 | A1* | 5/2010 | Araki | G06F 12/0246 711/103 |
| 2011/0041037 | A1 | 2/2011 | Frost et al. | |
| 2012/0072680 | A1 | 3/2012 | Kimura et al. | |
| 2012/0079318 | A1 | 3/2012 | Colgrove et al. | |
| 2012/0246443 | A1 | 9/2012 | Meir et al. | |
| 2013/0019057 | A1 | 1/2013 | Stephens | |
| 2013/0179753 | A1 | 7/2013 | Flynn et al. | |
| 2013/0202070 | A1 | 8/2013 | Sorrells et al. | |
| 2013/0290618 | A1 | 10/2013 | Werner et al. | |
| 2014/0164677 | A1* | 6/2014 | Borchers | G06F 3/0611 711/103 |
| 2014/0173188 | A1 | 6/2014 | Sakamoto | |
| 2014/0208004 | A1* | 7/2014 | Cohen | G06F 12/0246 711/103 |
| 2014/0281142 | A1 | 9/2014 | Nemazie et al. | |
| 2014/0351510 | A1 | 11/2014 | Chiu et al. | |
| 2015/0143038 | A1 | 5/2015 | Asnaashari et al. | |
| 2017/0010962 | A1* | 1/2017 | Yang | G06F 12/0246 |

FOREIGN PATENT DOCUMENTS

| | | |
|---|---|---|
| CN | 103034458 A | 4/2013 |
| CN | 103218270 A | 7/2013 |
| CN | 103577111 A | 2/2014 |
| CN | 103593260 A | 2/2014 |
| CN | 104156174 A | 11/2014 |
| CN | 104272261 A | 1/2015 |
| CN | 104407813 A | 3/2015 |
| CN | 104461391 A | 3/2015 |
| EP | 0 594 464 A2 | 4/1994 |
| EP | 0 732 653 A2 | 9/1996 |
| TW | 201324154 | 6/2013 |
| WO | 2015/008375 A1 | 1/2015 |

* cited by examiner

HOST DEVICE, ACCESS SYSTEM, AND ACCESS METHOD

CROSS REFERENCE TO RELATED APPLICATIONS

This application claims the benefit of U.S. Provisional Application No. 62/188,894, filed on Jul. 6, 2015, the contents of which are incorporated herein by reference.

This Application claims priority of China Patent Application No. 201610472229.4, filed on Jun. 24, 2016, the entirety of which is incorporated by reference herein.

BACKGROUND OF THE INVENTION

Field of the Invention

The invention relates to an access system and access method for redundant array of independent disks (RAID).

Description of the Related Art

The technology behind the redundant array of independent disks (RAID) is a data technology that combines multiple physical disk drives to form a disk array whose performance is equivalent to or even greater than a disk drive with an expensive price and a larger volume. Depending on the manner of reading and the redundancy function, the RAID technology is divided into several levels. Among these levels, RAID 5.0 is a manner of data storage with greater storage efficiency, advanced data security, and low storage cost. In a RAID 5.0 storage system, the host stores the data and the corresponding parity codes into different disk drives. Thus, when one of the disk drives is broken, the damaged data can be recovered using other data and the parity codes. However, the controller of each of the disk drives implemented by the RAID structure requires a respective flash translation layer (FTL) to perform the logic-physical translation, which increases the cost of the disk drives.

BRIEF SUMMARY OF THE INVENTION

An exemplary embodiment of a host device is provided. The host device comprises a processor and an interface. The processor generates a physical block address and a solid state disk (SSD) identification code according to a logical block address of an access operation. The interface is coupled to the processor. The processor indicates one of a plurality of SSDs through the interface according to the SSD identification code to access data at the physical block address.

An exemplary embodiment of an access system is provided. The access system comprises a host device and a plurality of solid state disks (SSDs). The host device comprises a processor and an interface. The processor generates a physical block address and an SSD identification code according to a logical block address of an access operation. The interface is coupled to the processor. The plurality of SSDs are coupled to the interface. The processor transmits the physical block address to one of the plurality of SSDs through the interface according to the SSD identification code. The one of the plurality of SSDs accesses data at the physical block address.

An exemplary embodiment of an access method is provided. The access method comprises the following steps: the processor of a host device generates a physical block address and a solid state disk (SSD) identification code according to a logical block address of an access operation; transmitting, by the processor, the physical block address to one of a plurality of SSDs through the interface according to the SSD identification code; and accessing, by the one of the plurality of SSDs, data at the physical block address.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
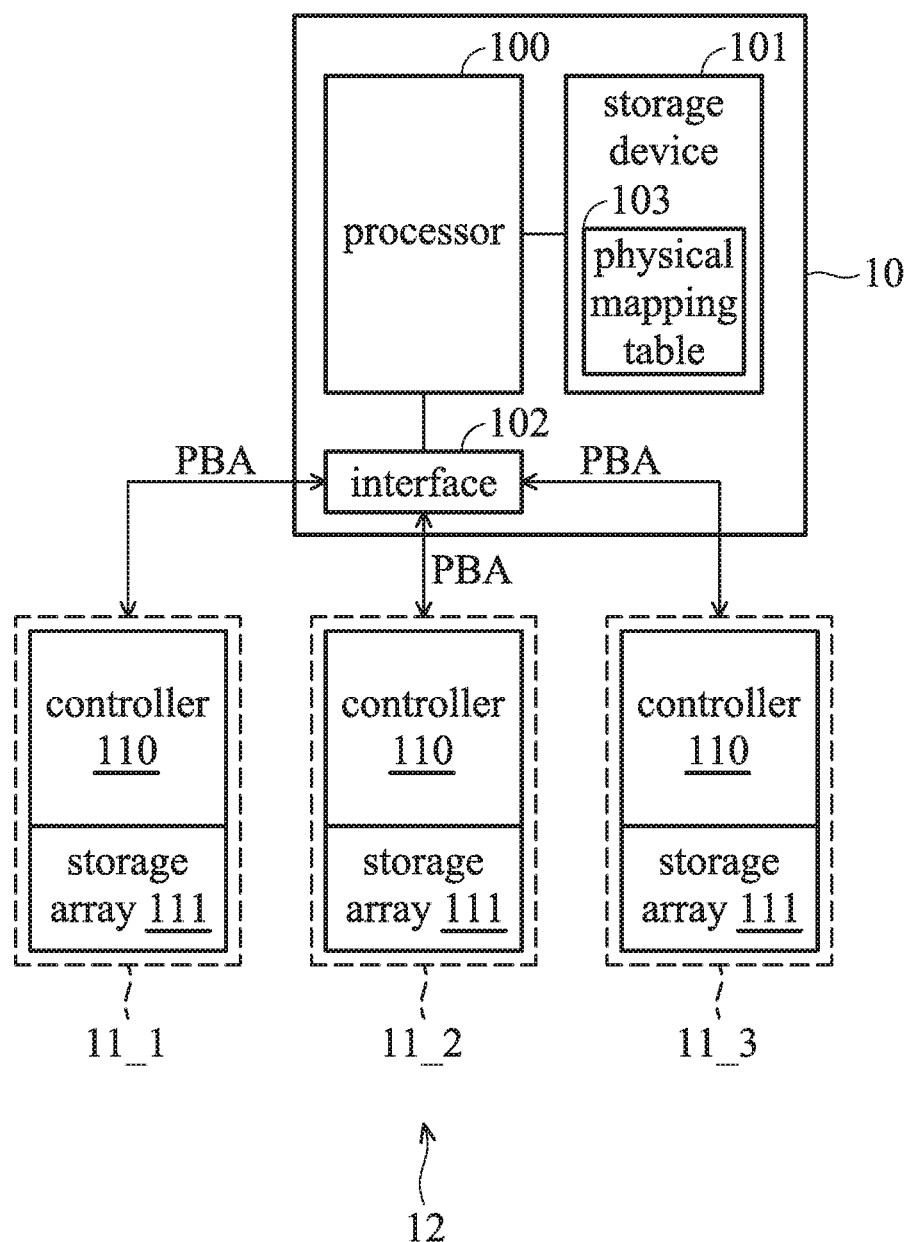
FIG. 1 shows an exemplary embodiment of an access system.

To better understand the technical aspects of the present invention, the following embodiments of the invention will be described in detail by referring to the drawings.

Figure 3:
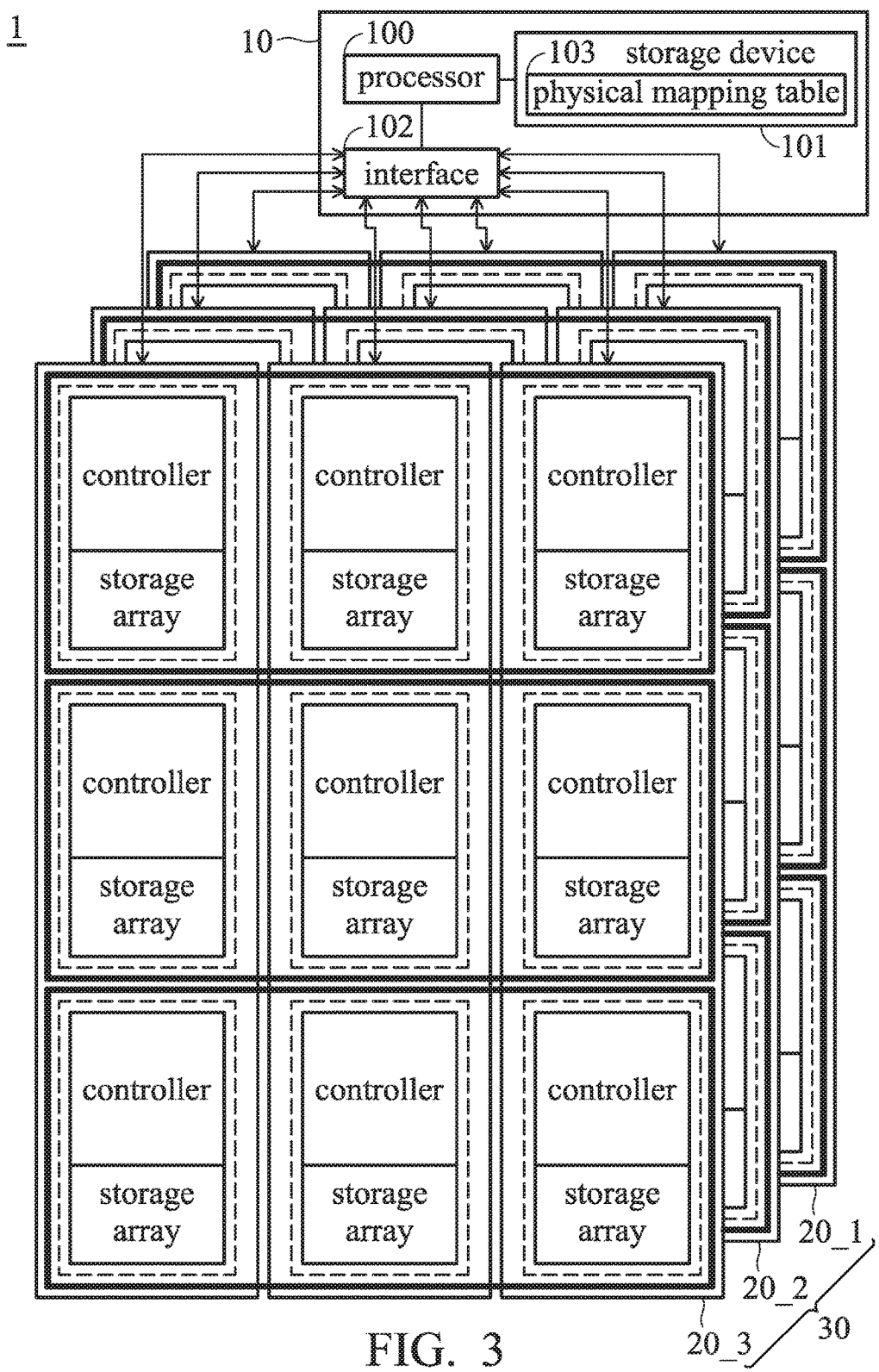
FIG. 3 shows another exemplary embodiment of an access system.

FIG. 1 shows an exemplary embodiment of an access system for a memory. As shown in FIG. 3, an access system 1 comprises a host device 10 and a plurality of solid state disks (SSDs). The host device 10 comprises a processor 100, a storage device 101, and an interface 102. In the embodiment, three SSDs 11_1-11_3 are given as an example for the embodiment of FIG. 1. The SSDs 11_1-11_3 are arranged to form a one-dimensional redundant array of independent disks (RAID) 12. Each solid state disk comprises a controller 110 and a storage array 111. The interface 102 is coupled between the processor 100 and the SSDs 11_1-11_3, so that the host device 10 can perform control and data access operations to the SSDs 11_1-11_3 through the interface 102. In the embodiment, the interface 102 is implemented by a serial advanced technology attachment (SATA) interface or a peripheral component interconnect express (PCIe) interface.

When the host device 10 performs an access operation to the RAID 12 to write data into the RAID 12 or read data from the RAID 12, the processor 100 receives a logical block address related to the access operation or generates a logical block address related to the access operation by itself. The processor 100 generates at least one physical block address PBA and at least one SSD identification code used for the data storage according to the logical block address. The SSD identification code is used to identify which SSD the corresponding physical block address PBA is on. In the following description, one physical block address and one SSD identification code are given as an example. When the SSD identification code generated by the processor 100 indicates, for example, the SSD 11_1, the processor 100 transmits the corresponding physical block address PBA to the SSD 11_1 indicated by the SSD identification code through the interface 102 according to the SD identification code. After the controller 110 of the SSD 11_1 receives the physical block address PBA, the SSD 11_1 directly accesses the data in the storage array 111 at the physical block address PBA. Moreover, the processor 100 further generates a physical block address PBA and an SSD identification code used for the parity-information storage. The processor 100 transmits the corresponding physical block address PBA to the corresponding SSD, for example the SSD 11_3, through the interface 102 according to the SD identification code used for the parity-information storage. After the controller 110 of the SSD 11_3 receives the physical block address PBA, the SSD 11_3 directly accesses the parity information in the storage array 111 at the physical block address PBA. In the embodiment, the parity information stored in the SD 11_3 is generated according to the corresponding data. In more detail, when the host device 10 performs an access operation to the SSD array 12 to write data into the SSD array 12, the processor 100 generates the corresponding parity information according to the data to be accessed into the SSD array 12; when the host device 10 performs an access operation to the SSD array 12 to read data from the SSD array 12, the parity information to be read was generated according to the corresponding data when the corresponding data was written into the SSD array 12. In the embodiment, since the SSDs 11_1-11_3 are arranged to form the one-dimensional RAID 12, the parity information comprises only horizontal parity codes, for example, the parity code(s) stored in the SD 11_3.

In an embodiment, the storage device 101 of the host device 10 stores a physical mapping table 103. The physical mapping table 103 comprises logical block address, physical block address PBA, and the relationship information concerning the logical block address and the physical block address. Accordingly, the processor 100 can check the physical mapping table 103 according to a logical block address to find at least one corresponding physical block address PBA and at least one corresponding SSD identification code.

In the above embodiment, the processor 100 generates one physical block address PBA and one SSD identification code according to the logical block address. In another embodiment, the processor 100 may generate a plurality of physical block addresses PBA and a plurality of SSD identification codes according to the logical block address. In this case, one set of one physical block address PBA and one SSD identification code indicates one specific position in one SSD. Each SSD performs the above operation to access the data at the specific position.

As described above, the controller 110 of each SSD directly receives the corresponding physical block address. Thus, each SSD does not require the respective flash translation layer (FTL) applied for the logic-physical block address translation and also does not require the storage space for storing the physical mapping table 103, which decreases the entire cost of the access system. Specifically, in the above embodiment, the operation of the logic-physical block address translation is performed by the host device 10. After, the host device 10 translates the logical block address to at least one corresponding physical block address, the host device 10 directly transmits the physical block address to the corresponding SSD.

Moreover, in the structure of the one-dimensional RAID 12 of the above embodiment, one SSD (for example, the SSD 11_3) is dedicated to the parity-information storage, while the other SSDs (for example, the SSDs 11_1-11_2) are dedicated to the data storage without the parity-information storage. The processor 100 can access the parity codes stored in the dedicated SSD directly. When one of the SSDs 11_1 and 11_2 is broken, the broken SSD can be replaced with a new SSD. Then, the processor 100 can read the data stored in the rest of the SSDs and the parity codes stored in the SSD 11_3 to recover the data which had been stored in the broken SSD.

Figure 2:
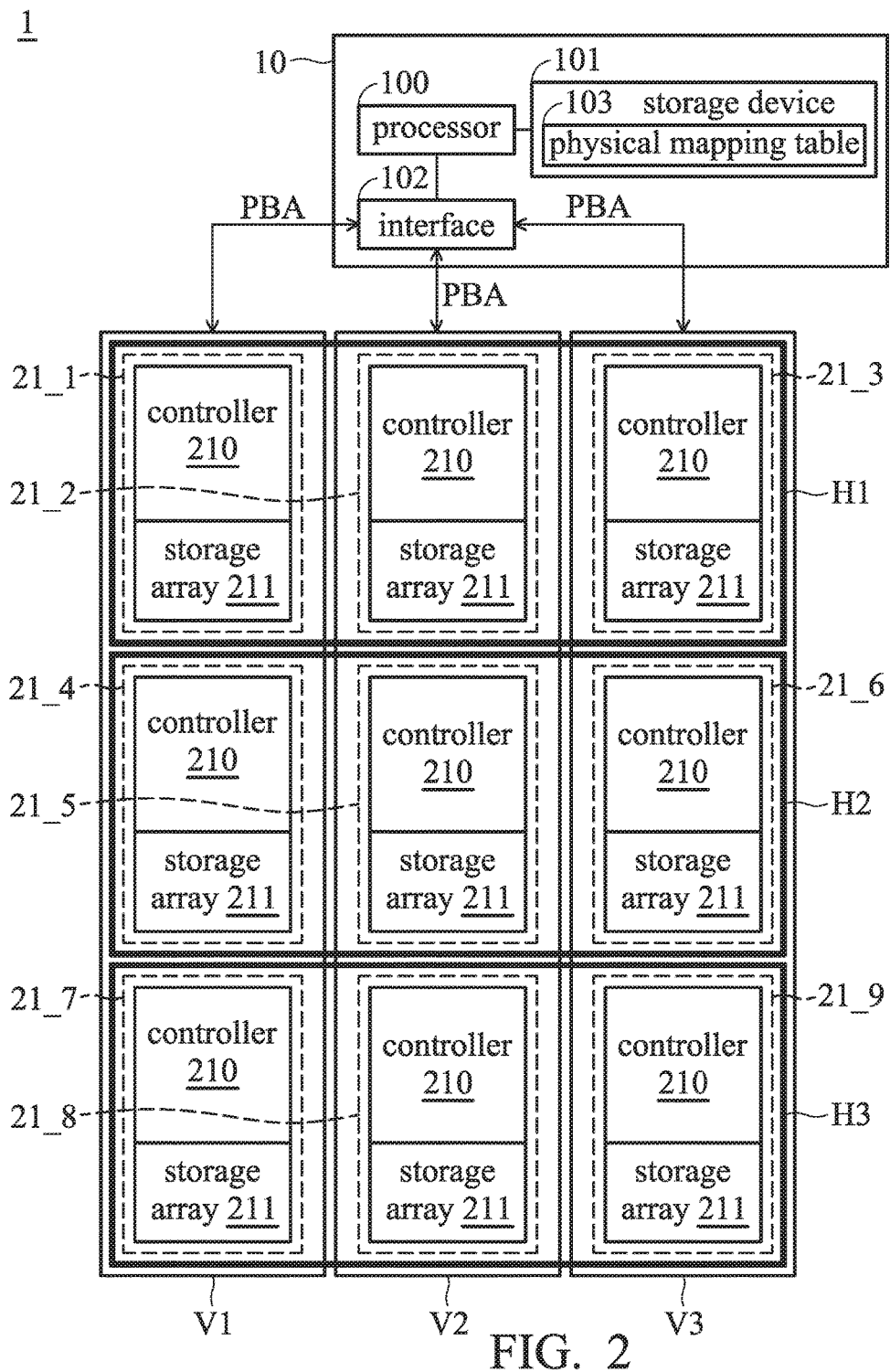
FIG. 2 shows another exemplary embodiment of an access system.

In the embodiment of FIG. 1, the access system 1 comprises three SSDs 11_1-11_3 which form the one-dimensional RAID 12. In other embodiments, the access system 1 may comprise more SSDs to form a two-dimensional RAID. As shown in the embodiment of FIG. 2, the access system 1 comprises nine SSDs 21_1-21_9 which are arranged on three horizontal rows H1-H3 (along the X-axis direction shown in FIG. 2) and three vertical columns V1-V3 (along the Y-axis direction shown in FIG. 2) to form a two-dimensional RAID 20. In the embodiment of FIG. 2, the operations performed by the host device 10 and the controllers 210 and the storage arrays 211 of the SSDs 21_1-21_9 for the data access are similar to the operations performed in the embodiment of FIG. 1, thus, the related description is omitted here. Note that, in the embodiment, the SSDs 21_3 and 21_6-21_9 are dedicated to the parity-information storage, while the other SSDs 21_1, 21_2, 21_4, and 21_5 are dedicated to the data storage without the parity-information storage. Thus, there is one dedicated SSD on each horizontal H1/H2 used for the parity-information storage, while there is one dedicated SSD on each vertical V1/V2 used for the data storage. Accordingly, the parity information stored in the two-dimensional RAID 20 of the embodiment includes horizontal parity codes and vertical parity codes. Each of the SSDs 21_1, 21_2, 21_4, and 21_5 corresponds to two SSDs used for the parity-information storage. In other words, the data stored in each of the SSDs 21_1, 21_2, 21_4, and 21_5 can be checked or recovered by using the parity codes stored in two SSDs used for the parity-information storage, thereby increasing the accuracy. For example, the data stored in the SSD 21_1 can be checked or recovered by using the horizontal parity code(s) stored in the SSD 21_3 and the horizontal parity code(s) stored in the SSD 21_7.

In the embodiment, the processor 100 also generates the parity code(s) stored in the SSD 21_9 according to the data to be accessed. The parity code(s) is used to check or recover the horizontal parity codes stored in the SSDs 21_3 and 21_6 and also the vertical parity code(s) stored the SSDs 21_7 and 21_8.

In another embodiment, the SSDs of the access system 1 form a three-dimension RAID. As shown in the embodiment of FIG. 3, the access system 1 comprises twenty-seven SSDs which are arranged to form a three-dimension RAID 30. The three-dimension RAID 30 is an array which is composed of three two-dimensional RAIDs with a depth (the Z-axis direction shown in FIG. 3). Each of the RAIDs 20_1-20_3 of FIG. 3 has a configuration that is similar to the RAID 20 of FIG. 2. In the embodiment of FIG. 3, the operations performed by the host device and the SSDs for data access are similar to the operations performed in the embodiments of FIGS. 1 and 2, thus, the related description is omitted here. Note that, in the embodiment, since the SSDs form the three-dimension RAID 30, the parity information generated by the processor 100 further comprises depth parity codes which are stored in the SSDs used for the parity-information storage in one of the RAIDs. For example, the depth parity codes generated by the processor 100 are stored in the SSDs 21_3 and 21_6-21_9 in the RAID 20_1. The depth parity codes are applied to check or recover the parity codes stored in the SSDs at the corresponding positions in the other RAIDs 20_2 and 20_3. For example, the depth parity codes stored in the SSD 21_3 of the RAID 20_1 are applied to check or recover the depth parity codes stored in the SSDs 21_3 of the RAIDs 20_2 and 20_3. Compared with the embodiment of FIG. 2, the accuracy of the data check and recovery in the embodiment of FIG. 3 is enhanced.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A host device comprising:
a storage device storing a physical mapping table;
a processor checking the physical mapping table according to a first logical block address and a second logical block address of an access operation to find a first physical block address, a second physical block address, a first solid state disk (SSD) identification code, and a second SSD identification code; and
an interface, coupled to the processor,
wherein the processor transmits the first physical block address which is found from the physical mapping table to one of a plurality of SSDs through the interface according to the first SSD identification code to access data at the first physical block address and transmits the second physical block address which is found from the physical mapping table to another one of the plurality of SSDs through the interface according to the second SSD identification code to access a horizontal parity code at the second physical block address,
wherein the plurality of SSDs are disposed outside of the processor,
wherein the plurality of SSDs form a redundant array of independent disks (RAID), and the RAID stores the data into a first SSD among the plurality of SSDs and further stores the horizontal parity code and a vertical parity code which correspond to the data respectively into a second SSD and a third SSD among the plurality of SSDs, and
wherein the processor generates the horizontal parity code and the vertical parity code according to the data and checks or recovers the data according to the horizontal parity code and the vertical parity code.

2. The host device as claimed in claim 1, wherein the interface is a serial advanced technology attachment (SATA) interface or a peripheral component interconnect express (PCIe) interface.

3. The host device as claimed in claim 1, wherein the RAID further stores a depth parity code.

4. The host device as claimed in claim 3, wherein the processor generates the depth parity code according to the horizontal parity code or the vertical parity code.

5. The host device as claimed in claim 1,
wherein the physical mapping table comprises the first and second logical block addresses, the first and second physical block addresses, and relationship information concerning the first and second logical block addresses and the first and second physical block addresses.

6. The host device as claimed in claim 1, wherein the processor accesses one of the data, the horizontal parity code, and the vertical parity code according to the SSD identification code.

7. The host device as claimed in claim 1, wherein the processor maintains a flash translation layer (FTL) to record mapping between the first and second logical block addresses and the first and second physical block addresses.

8. The host device as claimed in claim 7, wherein the mapping between the first and second logical block addresses and the first and second physical block addresses is recorded into the physical mapping table.

9. An access system comprising:
a host device comprising:
a storage device storing a physical mapping table;
a processor checking the physical mapping table according to a first logical block address and a second logical block address of an access operation to find a first physical block address, a second physical block address, a first solid state disk (SSD) identification code, and a second SSD identification code; and
an interface, coupled to the processor; and
a plurality of SSDs coupled to the interface and disposed outside of the host,
wherein the processor transmits the first physical block address which is found from the physical mapping table to a first SSD among the plurality of SSDs through the interface according to the first SSD identification code to access data at the physical block address and transmits the second physical block address which is found from the physical mapping table to a second SSD among the plurality of SSDs through the interface according to the second SSD identification code to access a horizontal parity code at the second physical block address,
wherein the plurality of SSDs form a redundant array of independent disks (RAID), and the RAID stores the data into the first SSD and further stores the horizontal parity code and a vertical parity code which correspond to the data respectively into a second SSD and a third SSD among the plurality of SSDs, and
wherein the processor generates the horizontal parity code and the vertical parity code according to the data and checks or recovers the data according to the horizontal parity code and the vertical parity code.

10. The access system as claimed in claim 9, wherein the interface is a serial advanced technology attachment (SATA) interface or a peripheral component interconnect express (PCIe) interface.

11. The access system as claimed in claim 9, wherein the RAID further stores a depth parity code.

12. The access system as claimed in claim 11, wherein the processor generates the depth parity code according to the horizontal parity code or the vertical parity code.

13. The access system as claimed in claim 9, wherein the physical mapping table comprises the first and second logical block addresses, the first and second physical block addresses, and relationship information concerning the first and second logical block addresses and the first and second physical block addresses.

14. The access system as claimed in claim 9, wherein the processor accesses one of the data, the horizontal parity code, and the vertical parity code according to the SSD identification code.

15. The access system as claimed in claim 9, wherein the processor maintains a flash translation layer (FTL) to record mapping between the first and second logical block addresses and the first and second physical block addresses.

16. The access system as claimed in claim 15, wherein the mapping between the first and second logical block addresses and the first and second physical block addresses is recorded into the physical mapping table.

17. An access method comprising:
storing a mapping table in a storage device of a host device;
checking, by a processor of the host device, the physical mapping table according to a first logical block address and a second logical block address of an access operation to find a first physical block address, a second physical block address, a first solid state disk (SSD) identification code, and a second SSD identification code;

transmitting, by the processor, the first physical block address which is found from the physical mapping table to one of a plurality of SSDs through the interface according to the first SSD identification code;

transmitting, by the processor, the second physical block address which is found from the physical mapping table to another one of the plurality of SSDs through the interface according to the second SSD identification code;

accessing, by the one of the plurality of SSDs, data at the first physical block address, accessing, by the another one of the plurality of SSDs, a horizontal parity code at the second physical block address; and generating, by the processor, the horizontal parity code and a vertical parity code according to the data, wherein the plurality of SSDs form a redundant array of independent disks (RAID), and the access method further comprises:

storing the data into a first SSD among the plurality of SSDs;

storing the horizontal parity code and the vertical parity code which correspond to the data respectively into a second SSD and a third SSD among the plurality of SSDs; and recovering, by the first processor, the data according to the horizontal parity code and the vertical parity code when the first SSD is broken.

18. The access system as claimed in claim 17, wherein the interface is a serial advanced technology attachment (SATA) interface or a peripheral component interconnect express (PCIe) interface.

19. The access system as claimed in claim 17, further comprising:
storing a depth parity code into the RAID.

20. The access method as claimed in claim 19, further comprising:
generating, by the processor, the depth parity code according to the horizontal parity code or the vertical parity code.

21. The access system as claimed in claim 17, wherein the physical mapping table comprises the first and second logical block addresses, the first and second physical block addresses, and relationship information concerning the first and second logical block addresses and the first and second physical block addresses.

22. The access method as claimed in claim 17, further comprising:
accessing, by the processor, one of the data, the horizontal parity code, and the vertical parity code according to the SSD identification code.

23. The access method as claimed in claim 17, wherein a flash translation layer (FTL) is maintained in the processor to record mapping between the first and second logical block addresses and the first and second physical block addresses.

24. The access method as claimed in claim 23, wherein the mapping between the first and second logical block addresses and the first and second physical block addresses is recorded into the physical mapping table.

* * * * *